United States Patent
Hung et al.

(10) Patent No.: US 7,548,462 B2
(45) Date of Patent: Jun. 16, 2009

(54) DOUBLE PROGRAMMING METHODS OF A MULTI-LEVEL-CELL NONVOLATILE MEMORY

(75) Inventors: Chun-Hsiung Hung, Hsinchu (TW); Wen-Chiao Ho, Tainan (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 81 days.

(21) Appl. No.: 11/771,310

(22) Filed: Jun. 29, 2007

(65) Prior Publication Data

US 2009/0003054 A1    Jan. 1, 2009

(51) Int. Cl.
G11C 16/06 (2006.01)
(52) U.S. Cl. .......................... 365/185.22; 365/185.24; 365/185.14; 365/185.19
(58) Field of Classification Search ............ 365/185.22, 365/185.24, 185.14, 185.19
See application file for complete search history.

(56) References Cited

U.S. PATENT DOCUMENTS

| | | | |
|---|---|---|---|
| 6,331,951 B1 * | 12/2001 | Bautista et al. | ........ 365/185.22 |
| 6,529,412 B1 | 3/2003 | Chen et al. | |
| 6,714,457 B1 | 3/2004 | Hsu et al. | |
| 6,768,673 B1 | 7/2004 | Hsia et al. | |
| 2007/0097749 A1 * | 5/2007 | Li et al. | .................. 365/185.22 |
| 2007/0140019 A1 * | 6/2007 | Yeh et al. | ................ 365/185.28 |

* cited by examiner

Primary Examiner—Thong Q Le
(74) Attorney, Agent, or Firm—Haynes Beffel & Wolfeld LLP

(57) ABSTRACT

A method for double programming of multi-level-cell (MLC) programming in a multi-bit-cell (MBC) of a charge trapping memory that includes a plurality of charge trapping memory cells is provided. The double programming method is conducted in two phrases, a pre-program phase and a post-program phase, and applied to a word line (a segment in a word line, a page in a word line, a program unit or a memory unit) of the charge trapping memory. A program unit can be defined by input data in a wide variety of ranges. For example, a program unit can be defined as a portion (such as a page, a group, or a segment) in one word line in which each group is selected for pre-program and pre-program-verify, either sequentially or in parallel with other groups in the same word line.

31 Claims, 12 Drawing Sheets

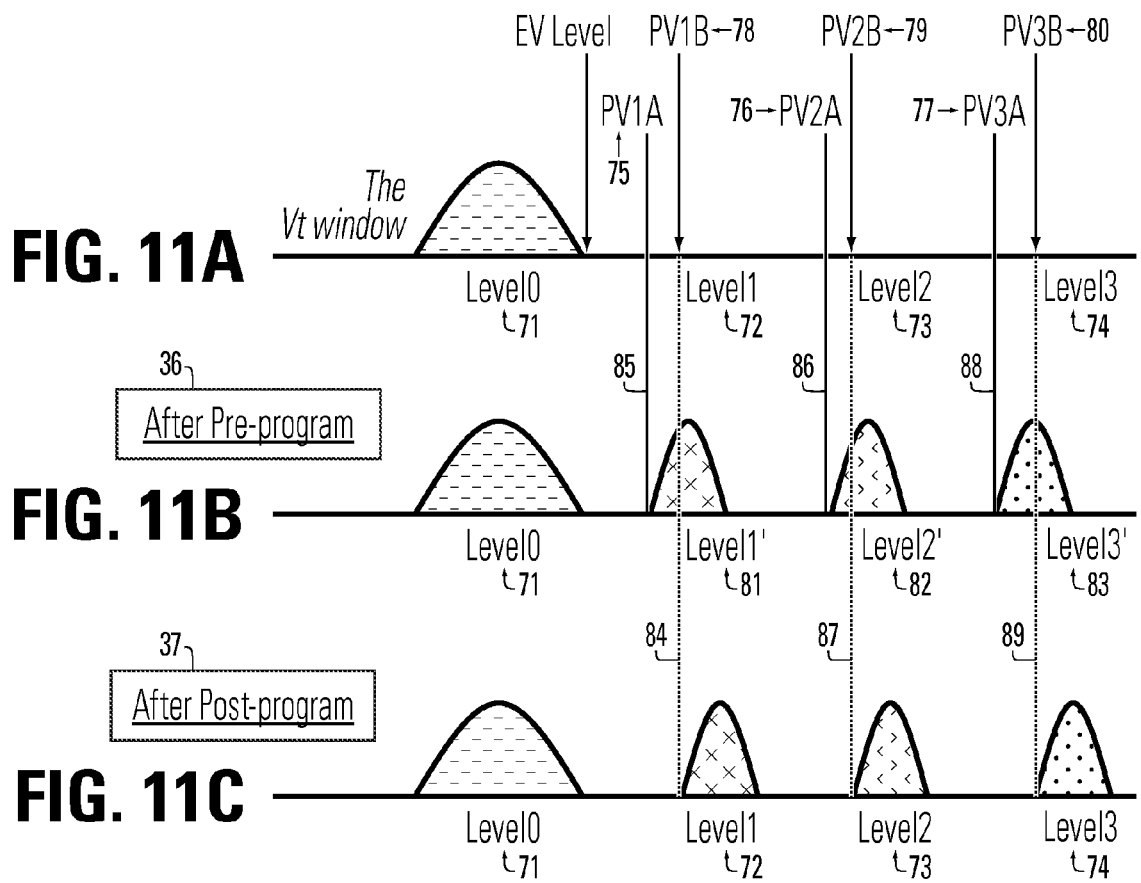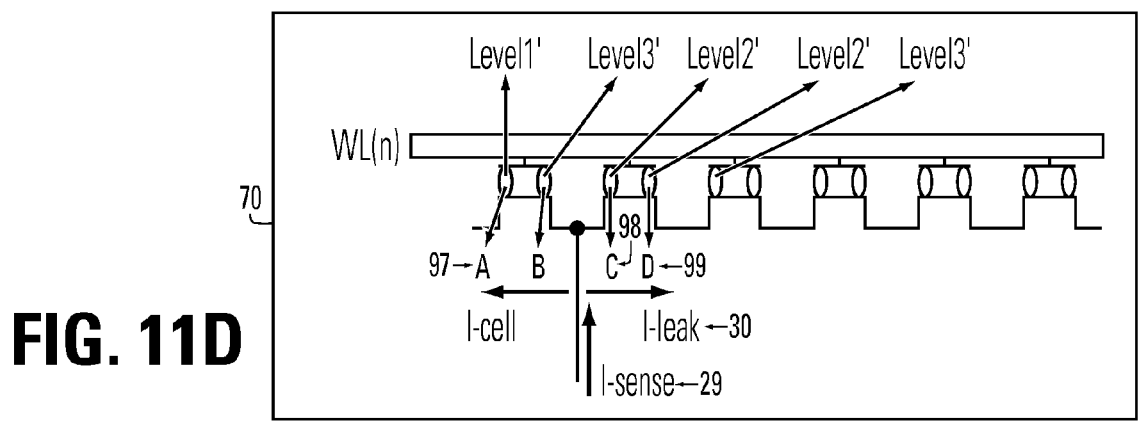

DOUBLE PROGRAMMING METHODS OF A MULTI-LEVEL-CELL NONVOLATILE MEMORY

BACKGROUND OF THE INVENTION

1. Field of the Invention

The present invention relates generally to electronic data storage devices, and more particularly, to nonvolatile semiconductor memory devices and a method for programming a multi-level-cell (MLC) in a multi-bit-cell (MBC) of a charge trapping memory.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Charge trapping memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a charge trapping memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology keeps scaling down.

A traditional floating gate device stores 1 bit of charge in a conductive floating gate. The advent of charge trapping memory cells provides the ability to store 2 bits of flash cells in an Oxide-Nitride-Oxide (ONO) dielectric. In a typical structure of a charge trapping memory cell, a nitride layer is used as a trapping material positioned between a top oxide layer and a bottom oxide layer. The charge in the ONO dielectric with a nitride layer may be trapped on either the left side or the right side of a charge trapping memory cell. The interaction of the left bit and the right bit, also known as a second bit effect, limits a voltage threshold window between programmed and erased states. The second bit effect consequently affects the size of an operation window, which in turn potentially caps the scalability on the number of bits in the charge trapping memory cells.

Accordingly, it is desirable to have a multi-level-cell program method that reduces or eliminates the high boundary shift of lower Vt level in one or more charge trapping memory cells in a memory array.

SUMMARY OF THE INVENTION

A method for double programming of multi-level-cell (MLC) programming in a multi-bit-cell (MBC) of a charge trapping memory that includes a plurality of charge trapping memory cells is provided. The double programming method is conducted in two phrases, a pre-program phase and a post-program phase, and applied to a word line (a segment in a word line, a page in a word line, a program unit or a memory unit) of the charge trapping memory. A program unit can be defined by input data in a wide variety of ranges. For example, a program unit can be defined as a portion (such as a page, a group, or a segment) in one word line in which each group is selected for pre-program and pre-program-verify, either sequentially or in parallel with other groups in the same word line.

During the pre-program phase, pre-program and pre-program-verify operations are applied to a selected length, either a word line or a page unit, where the page unit is programmed to a lower pre-program level with a lower pre-program-verify level. The pre-program and pre-program-verify operations produce a bit status between adjacent charge trapping sites in a charge trapping memory cell where each charge trapping memory cell has a first charge trapping site for storing one or more bits and a second charge trapping site for storing one or more bits.

During the post-program phase, post-program and post-program-verify operations are applied to the word line or the page unit such that the program unit is programmed to a final (a predetermined) post-program level and a final (or a predetermined) post-program-verify level. The undesirable complementary bit effect and array effect are significantly suppressed during the post-program phase with the confirmation of adjacent bit status.

In a first embodiment, the pre-program and pre-program-verify operations are applied to an entire word line in a sequential manner. In the multi-level-cell of a multi-bit-cell charge trapping memory, a charge trapping memory cell includes, for example, four bits or four voltage levels, a zero program voltage level, a first threshold level, a second voltage threshold level, and a third voltage threshold level. A first level pre-program and a first level pre-program-verify are applied to the selected word line, followed by a second level pre-program and a second level pre-program-verify which are applied to the selected word line, and followed by a third level pre-program and a third level pre-program-verify which are applied to the selected word line. Similarly, the post-program and post-program-verify operations are applied to an entire word line in a sequential manner.

In a second embodiment, the pre-program and pre-program-verify operations are applied to a page unit in a sequential manner, where the page unit is less than the length of an entire word line. After completing a loop of pre-program and pre-program-verify operations, a word line in which the page unit is associated is checked to determine if an entire word line has undergone pre-program and pre-program-verify operations. If there remain additional charge trapping memory cells in the selected word line, then the method is repeated for additional pre-program and -preprogram-verify cycles.

In a third embodiment, the sequence of pre-program and pre-program-verify operations are carried out from a first program voltage, to a second program voltage, and to a third program voltage in a reversed sequence. Instead of programming from a lower voltage level to a higher voltage level, the sequence goes from a higher voltage level to a lower voltage level, i.e. a third pre-program voltage, to a second pre-program voltage, and to a first pre-program voltage.

In a fourth embodiment, the pre-program and pre-program-verify operations are applied simultaneously (or in parallel) to an entire word line, or a plurality of page units within a word line, wherein the method involves the application of a first level program, a second level program and a third level program in parallel. The simultaneous programming of all three pre-program levels may require three bias conditions where each bias condition corresponds with a particular pre-program voltage level. During the program-verify operation, all three program-verify levels are read at the same time.

Broadly stated, a method for double programming a multi-level-cell (MLC) in a multi-bit-cell (MBC) of a charge trapping memory, the charge trapping memory having an array of charge trapping memory cells connecting to a plurality of word lines, each word line is connected to a plurality of charge trapping memory cells, each charge trapping memory cell having a first trapping site and a second trapping site, comprises receiving a data pattern including a sequence of programming levels; during a first programming phase, conducting a first program operation and a first program-verify operation to a plurality of charge trapping memory cells along a word line to a lower data pattern relative to the sequence of programming levels in the data pattern, the first program operation programming the plurality of charge trapping memory cells along the word line to a first voltage program level that is less than a predetermined program voltage level, the first program-verify operation verifying charge trapping memory cells in the plurality of charge trapping memory cells along the word line to a first voltage verifying level that is less than a predetermined program-verify level; and during a second programming phase, conducting a second programming operation and a second program-verify operation of the plurality of charge trapping memory cells along the word line, the second programming operation programming the plurality of charge trapping memory cells along the word line to a second voltage programming level that is about (or substantially) equal to the predetermined program voltage level, the second program-verify operation verifying the plurality of charge trapping memory cells along the word line to a second voltage verifying level that is about equal to (or not less than) the predetermined program-verify level.

Advantageously, the present method provides programming and program-verify techniques of multi-level-cells in a multi-bit-cell charge trapping memory while reducing or suppressing second bit effect and array effect.

The structures and methods of the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

The invention will be described with respect to specific embodiments thereof, and reference will be made to the drawings, in which:

FIGS. 11A-11D illustrate sample graphical diagrams of waveforms representative of pre-program and post-program phases and generating a lower-user-pattern in accordance with one embodiment.

DETAILED DESCRIPTION

Figure 1:
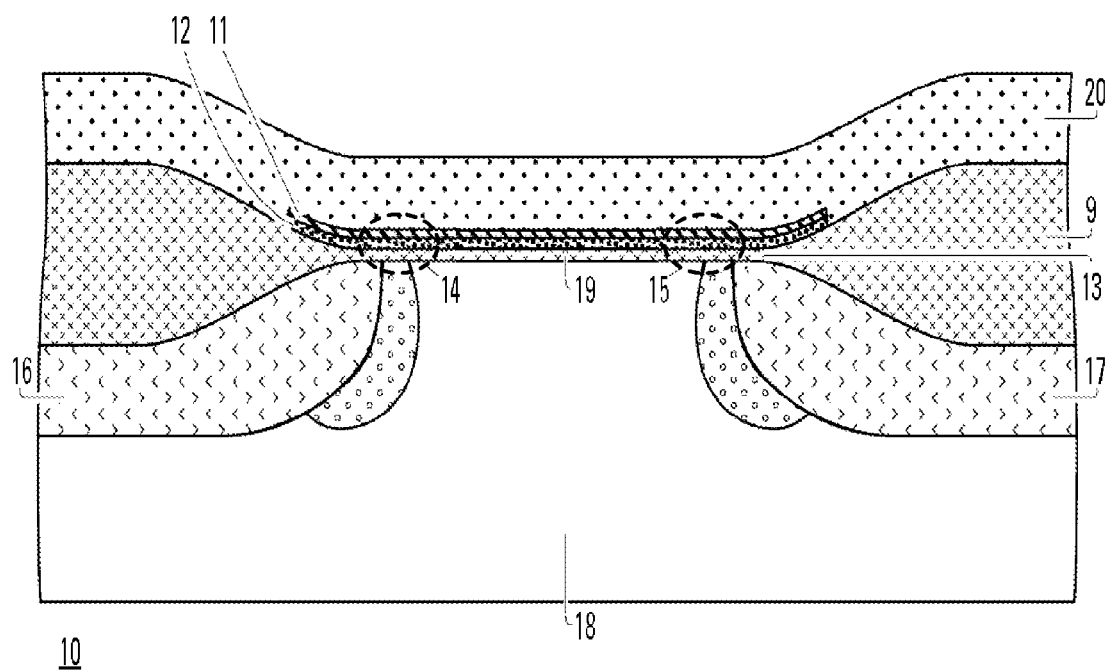
FIG. 1 is a process diagram illustrating a multi-bit-cell in a charge trapping memory cell of a charge trapping memory in accordance with one embodiment.

A description of structural embodiments and methods of the present invention is provided with reference to FIGS. 1-10. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a process diagram illustrating a multi-bit-cell in a charge trapping memory cell 10 of a charge trapping memory. The charge trapping memory cell 10 includes a multi-layer charge trapping structure of a first dielectric layer 11, a charge trapping layer 12, and a second dielectric layer 13. An example of a suitable material for implementing the first and second dielectric layers 11, 13 is an oxide material. An example of a charge trapping layer 12 is silicon nitride. The charge trapping memory cell 10 in this embodiment includes two charge trapping sites 14, 15, with the first charge trapping site 14 providing a first location to store a first bit and the second charge trapping site 15 providing a second location to store a second bit.

There are two effects that arise from the choice of the multi-bit-cell of the charge trapping memory cell 10, which can be used in a virtual ground array. The charge trapping memory cell 10 provides the ability to store a first bit at the first charge trapping site 14, and a second bit at the second charge trapping site 15. The first effect is referred to as a second bit effect or a complementary effect. When one of the charge trapping sites 14,15 is programmed, the bit at the other charge trapping site, i.e. the non-programming bit, is affected because the programming of a bit at one charge trapping site affects the other bit at the other charge trapping site. For example, if the first bit in the first charge trapping site 14 is selected for programming, the programming of the first bit in the first charge trapping site 14 may cause a voltage to the second bit in the second charge trapping site 15 to rise slightly. If the second bit in the second charge trapping site 15 is selected for programming, the first bit in the first charge trapping site 14 may also be affected in increasing a voltage in the first bit due to the programming of the second bit.

The second effect to the charge trapping memory cell 10 is referred to as an array effect or a side leakage effect. The principle of the array effect is further described with respect to FIG. 3.

The charge trapping storage cell structure 10 is manufactured with a bit line n+ implant 16 and a bit line n+ implant 17 on a p-type substrate 18. A channel 19 extends from a right edge of the bit line n+ implant 16 to the left edge of the bit line n+ implant 17. A tungsten silicide (WSi2) and poly gate 20 overlays the first dielectric layer 11. A bit line oxide 9 is disposed between the bit line n+ implant 17 and the WSi and poly gate 20.

Figure 2:
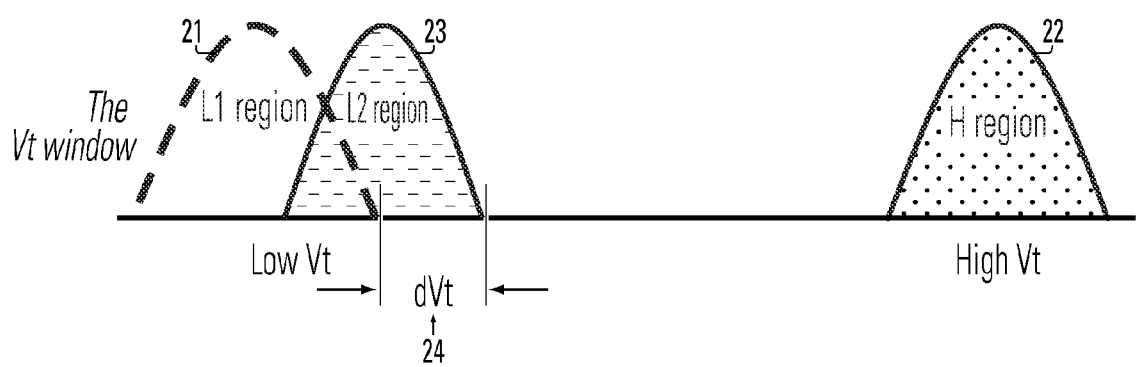
FIG. 2 is a graphical diagram illustrating a complementary bit disturbance, or a second bit effect, between the first charge trapping site and the second charge trapping site the charge trapping memory cell in accordance with one embodiment.

FIG. 2 is a graphical diagram illustrating a complementary bit disturbance, or a second bit effect, between the first charge trapping site 14 and the second charge trapping site 15 of the charge trapping memory cell 10. Due to the interaction between two bits in the charge trapping memory cell 10, i.e. the first bit in the first charge trapping site 14 and the second bit in the second charge trapping site 15, the threshold voltage of an un-programmed trapping site is affected due to the complementary bit effect. A voltage threshold window in the charge trapping memory cell 10 has a low threshold region 21 and a high threshold region 22. Initially, the first bit in the first charge trapping site 14 and the second bit in the second charge trapping site 15 have a voltage value that is in the low threshold region 15 identified as L1 region. When the second bit in the second charge trapping site 15 is programmed to a high voltage threshold level, as indicated by the high voltage threshold region 22, the first bit in the first charge trapping site 14 also rises slightly to another low threshold region identified as L2 region 23. Although the first bit in the first charge trapping site 15 is not programmed in this instance, the second bit effect, also known as a complementary bit disturbance, causes a voltage threshold in the first bit to rise when the second bit in the second charge trapping site 15 is programmed. The shift in the voltage, denoted as dVt 24, of the threshold for the second bit in the second charge trapping site 15 from L1 region 21 to L2 region 23 is what is referred to as complementary bit disturbance or a second bit effect. The result of the second bit effect is similar in program behavior as a complementary lower voltage threshold (or erased Vt) bit.

Figure 3:
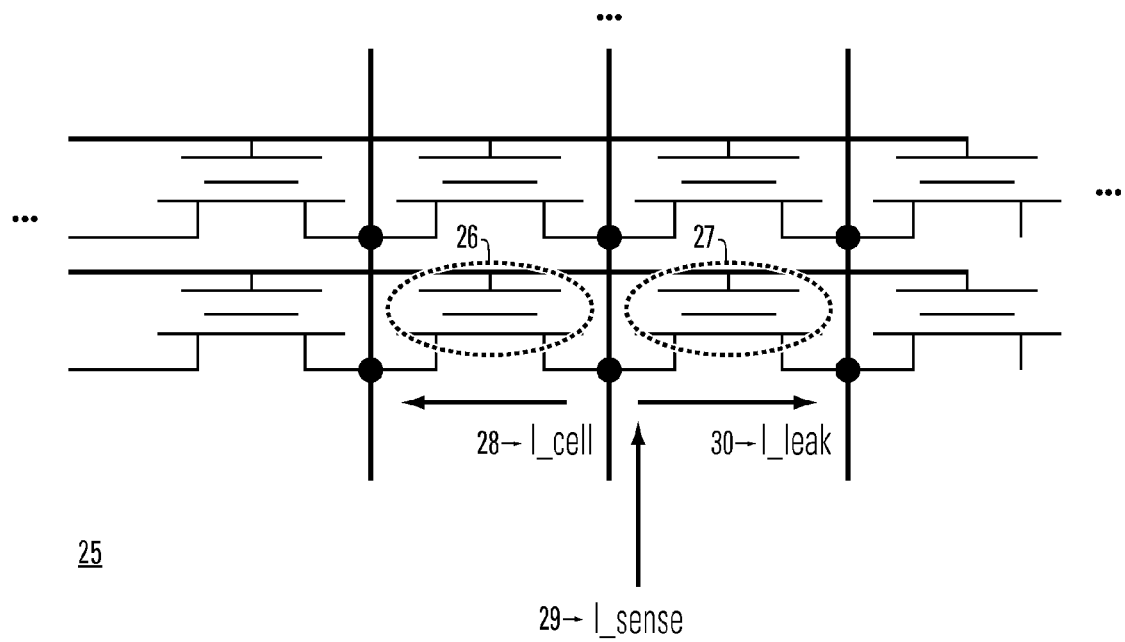
FIG. 3 is a circuit diagram illustrating an array effect, or a side leakage effect, of charge trapping memory cells in a virtual ground array memory structure in accordance with one embodiment.

FIG. 3 is a circuit diagram illustrating an array effect, or a side leakage effect, of charge trapping memory cells in a virtual ground array memory structure 25. The array effect originates from an environment differential that may occur during a program-verify phase and a read phase, which results in a shift in a threshold voltage. In this example, suppose that a first charge trapping site, or a cell A 26, has been programmed. A program-verify operation is carried out to determine if the programmed voltage in the first charge trapping site in the cell A 26 is sufficiently high. To conduct a program-verify operation, it is necessary to do a read operation. During a read operation of a charge trapping memory cell, which is also referred to as a program-verify operation, the amount of a cell current 27, I_cell, may not be equal to a sensing current 29, I_sense, due to a leakage current 30, I_leak, flowing to a second charge trapping site 27, or cell B. The sense current 29 is the parameter that indicates how large an electrical current is supplied to charge trapping memory cell. The sense current 29 is likely to be a value that is less than the cell current 28. The mathematical relationship between the I_cell 28, I_sense 29, and I_leak 30 can be represented as follows:

$$I\_sense = I\_cell + I\_leak$$

Due to the leakage to cell B 27, the voltage value of the cell A 26 may be read as being in a high voltage state. A subsequent program pulse is supplied to the cell A 26 so that the voltage threshold of the cell A 26 is sufficiently high in order to pass a program-verify operation.

When a programming operation is conducted to the cell B 27, the reading of the cell A 26 reflects that the I_cell 28 has a lower current than during the program-verify phase of the cell A 26. The cell A 26 has a low voltage threshold when the cell B 27 is programmed. The programming of the cell B 27 causes the leakage current, I_leak 30, to be suppressed, such that the sense current 29 is equal to the cell current 28, I_sense=I_cell.

Figure 4:
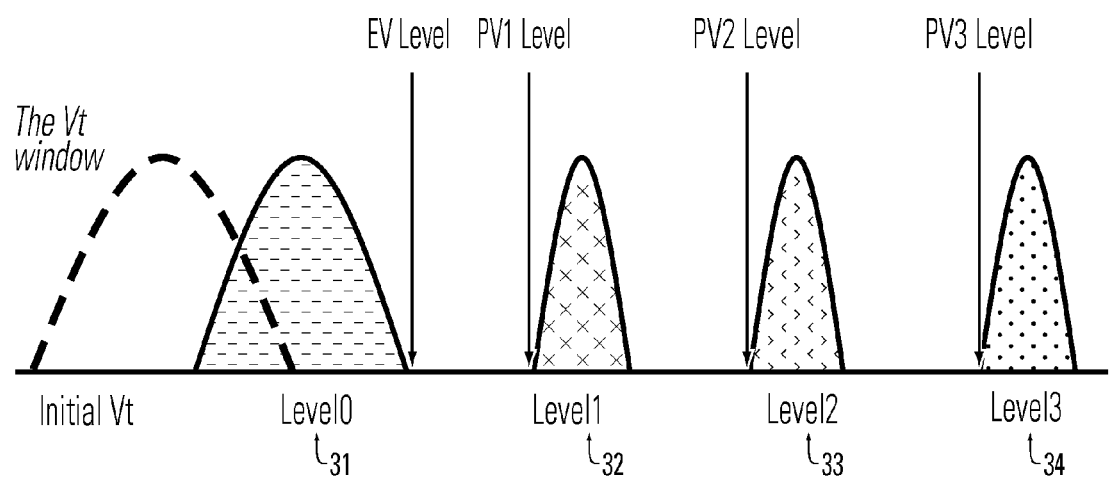
FIG. 4 illustrates a multi-level-cell of a multi-bit-cell memory cell for increasing the total number of bits from two bits to four bits with an allocation of electrical ranges by separating the levels of threshold voltages in accordance with one embodiment.

As a technique to increase the density of the charge trapping memory device 10 within the confines of a memory cell area, a graph in FIG. 4 shows a multi-level-cell of a multi-bit-cell memory cell (also referred to N-bit) for increasing the total number of bits from two bits to four bits with an allocation of electrical ranges by separating the levels of threshold voltages. In one MLC implementation, the program levels (or threshold voltage levels) in a first program level (level0) 31, a second program level (level1) 32, a third program level (level2) 33, and a fourth program level (level3) 34 are represented respectively in binary formats as 11, 01, 10, and 00. In another MLC implementation, the program voltage levels are represented in binary formats as 11, 01, 00, and 10. In a further MLC implementation, the program voltage levels are represented in binary formats as 11, 10, 00, and 01. One of skill in the art should recognize that the threshold voltage level definitions are not limited to these three examples, but other threshold voltage level definitions can be practiced without departing from this illustrative embodiment.

To build a multi-level-cell in a multi-bit-cell charge trapping memory cell, each charge trapping site 14 or 15 in the charge trapping memory cell 10 includes two voltage threshold Vt levels such that the charge trapping memory cell 10 effectively contains four bits of information, two bits in the first charge trapping site 14 and two bits in the second charge trapping site 15. For example, the first charge trapping site 14 stores a first bit and a third bit, and the second charge trapping site 15 stores a second bit and a fourth bit. One of skill in the art should recognize that additional Vt levels can be applied to each of the charge trapping site 14 or 15 in the charge trapping memory cell 10 in order to produce an even greater number of bits, such as 8, 16, or more bits.

Figure 5:
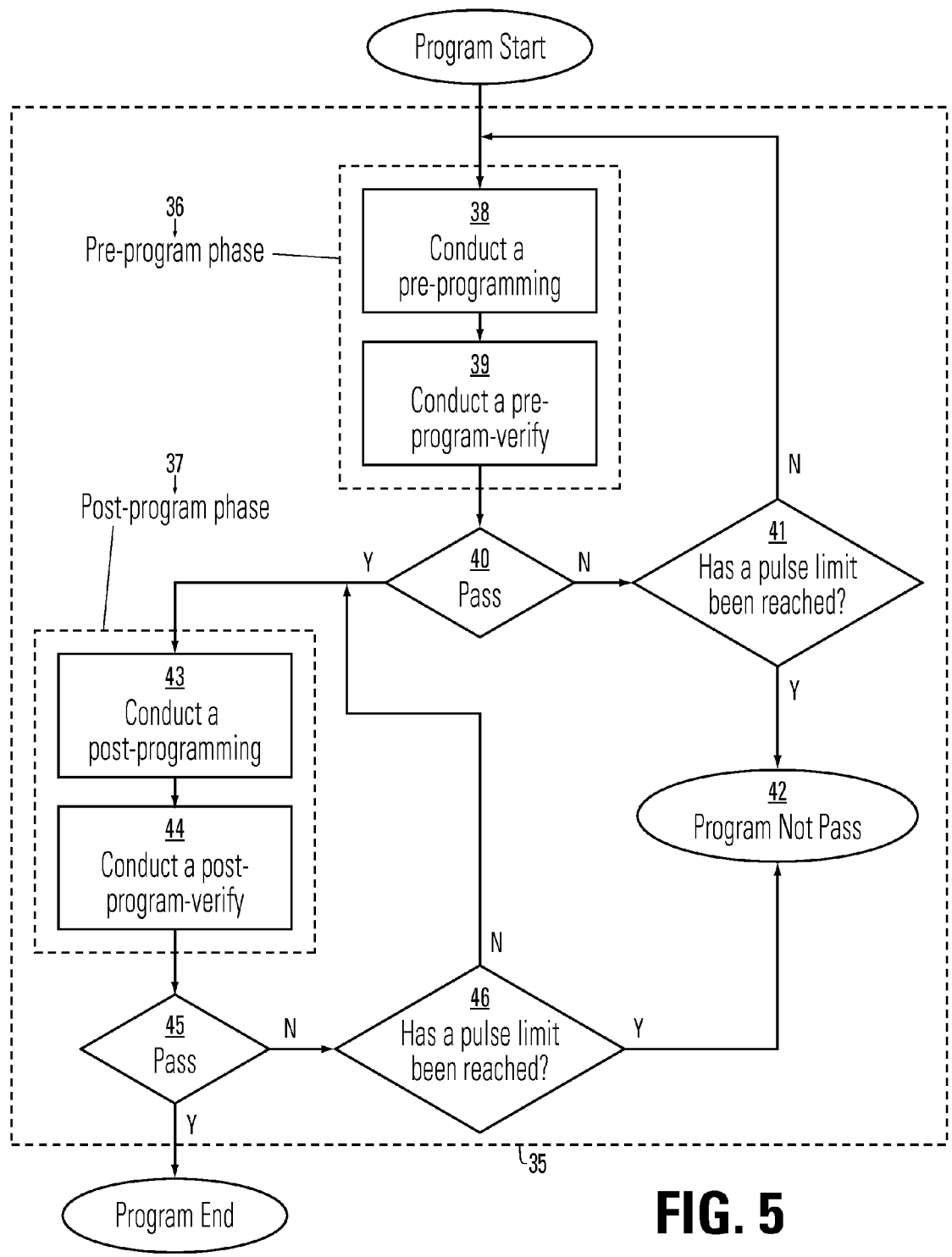
FIG. 5 is a flow diagram illustrating a method for double-programming with a pre-program phase and post-program phase in accordance with one embodiment.

The expansion to four voltage levels requires a tighter voltage threshold distribution while addressing a complementary bit effect or an array effect, which is described in a method with respect to FIG. 5. FIG. 5 is a flow diagram illustrating a method 35 process of double-programming with a pre-program phase 36 and post-program phase 37. During the pre-program phase 36, the charge trapping cell 10 (or the memory 25) undergoes a program operation 38 and a program-verify operation 39 of a pattern to lower-program-verify levels, such as a first level program-verify PV1A, a second level program-verify PV2A, and a third level program-verify PV3A, where the symbol A denotes that the program-verify operations occur during a pre-program phase. At step 40, the charge trapping cell 10 is tested to determine if a programmed bit passes a predetermined threshold voltage level. If the charge trapping memory cell 10 does not pass the program-verify level, it is determined at step 41 whether a pulse limit, which is a number that represents a maximum number of retries, has been reached. If the pulse limit has been reached, the flow of the method 35 returns to step 38 to conduct another pre-program operation. The charge trapping memory cell 10 is determined to not have passed the program-verify level if the pulse limit has been reached at step 42.

After the charge trapping memory cell 10 has passed the pre-program-verify operation, the charge trapping memory cell 10 then undergoes a second program operation, which is referred to as a post-program phase 37. During the post-program phase 37, the charge trapping cell 10 undergoes a program operation 43 and a program-verify operation 44 of a pattern that is applied to final program-verify levels, such as a first level program-verify PV1B, a second level program-verify PV2B, and a third level program-verify PV3B, where the symbol B denotes that the program-verify operations occur during a post-program phase with the program-verify levels set at final levels. At step 45, charge trapping cells in a page unit or a word line are tested to determine if a programmed bit passes a predetermined threshold voltage level. If the charge trapping memory cell 10 does not pass the program-verify level, it is determined at step 46 whether a pulse limit, which is a number that represents a maximum number of retries, has been reached. If the pulse limit has been reached, the flow of the method 35 returns to step 38 in which another pre-program operation is conducted. The charge trapping memory cell 10 is determined not to have passed the program-verify level if the pulse limit has been reached at step 42.

Figure 6:
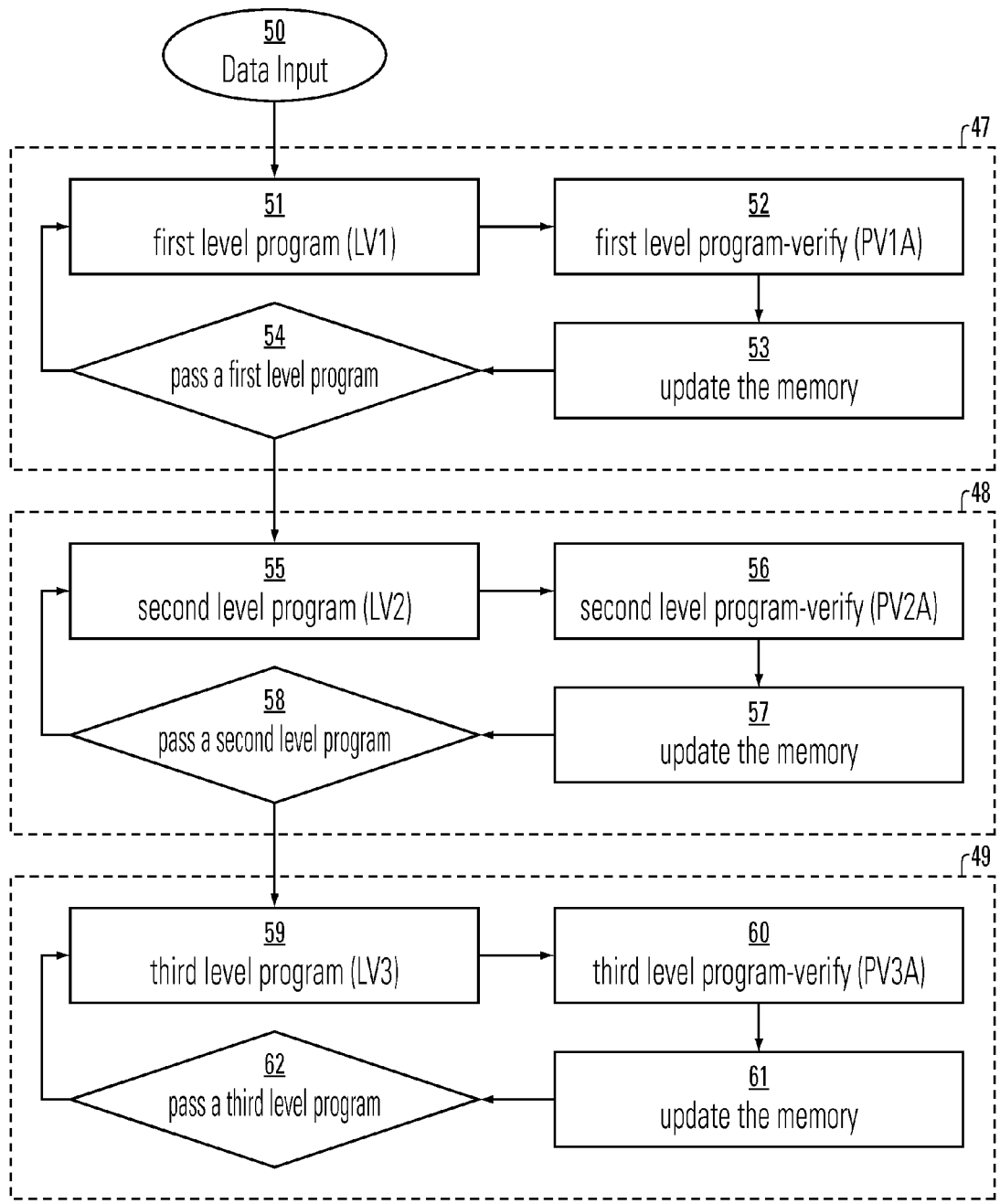
FIG. 6 is a flow diagram of a first embodiment of the pre-program phase for conducting program and program-verify operations of the charge trapping memory cell in accordance with one embodiment.

FIG. 6 illustrates a flow diagram of a first embodiment of the pre-program phase 36 for programming the charge trapping memory cell 10. There are three different program-verify levels in this embodiment, a first program and program-verify level 47, a second program and program-verify level 48, and a third program and program-verify level 49. Although this embodiment describes a serial programming process, the method can be extended to a parallel programming process. At step 50, user data is entered to specify a charge trapping memory cell, or a range of charge trapping memory cells defined as a page unit or an entire word line. For simplicity of description, the following description refers to a word line, although a page unit in a word line can be selected as the range for program and program-verify operations. The data may require some combination of a first level program, a second level program, or a third level program of the selected word line of charge trapping memory cells. For example, one word line of data typically includes about 16 pages, where each page requires two kilobytes of data. The program flow starts from the first program and first program-verify level 47, to the second program and second program-verify level 48, and then the third program and third program-verify level 49. In this embodiment, the second program and program-verify level is at a level is higher than the first program and program-verify level. The third program and program-verify level is at a level higher than the second program and program-verify level.

During the first level program and program-verify level 47 in the pre-program phase 36, the selected word line of charge trapping memory cells is applied with a first level program level (LV1) at step 51. At step 52, the charge trapping memory cells in the selected word line undergo a first level program-verify operation (PV1A). The information generated from the first level program-verify, indicating which charge trapping memory cell or cells have passed the first level program-verify operation and which charge trapping memory cell or cells have not passed the first level program-verify operation, is stored and updated at step 53 in a memory integrated circuit, such as an SRAM. In particular, the charge trapping memory cells that have not passed the first level program-verify operation may require a higher level of programming voltage during subsequent programming operations. The charge trapping memory cells in the selected word line are then tested to determine if the programming of the charge trapping memory cells passes the first level program-verify level at step 54. After the charge trapping memory cells in the selected word line have passed the first program and program-verify level 47, the charge trapping memory cells in the word line undergo the second program and program-verify level 48.

During the second level program and program-verify level 48 in the pre-program phase 36, the charge trapping memory cells in the selected word line are applied with a second level program level (LV2) at step 55. At step 56, the charge trapping memory cells in the selected word line undergo a second level program-verify level (PV2A). The information generated from the second level program-verify is updated at step 57 in the memory integrated circuit. The charge trapping memory cells in the word line are then tested to determine if the programming of the charge trapping memory cells in the word line passes the second program-verify level at step 58. After the charge trapping memory cells in the word line have passed the second program and program-verify level 48, the charge trapping memory cells in the word line undergo the second program and program-verify level 49. During the third level program and program-verify level 49 in the pre-program phase 36, the charge trapping memory cells in the selected word line are applied with a third level program level (LV3) at step 59. At step 60, the charge trapping memory cells in the selected word line undergo a third level program-verify level (PV3A). The information generated from the third level program-verify is updated in the memory integrated circuit at step 61. At step 62, the charge trapping memory cells in the selected word line are then tested to determine if the programming of the charge trapping memory cells of the selected word line passes the third program-verify level.

Figure 7:
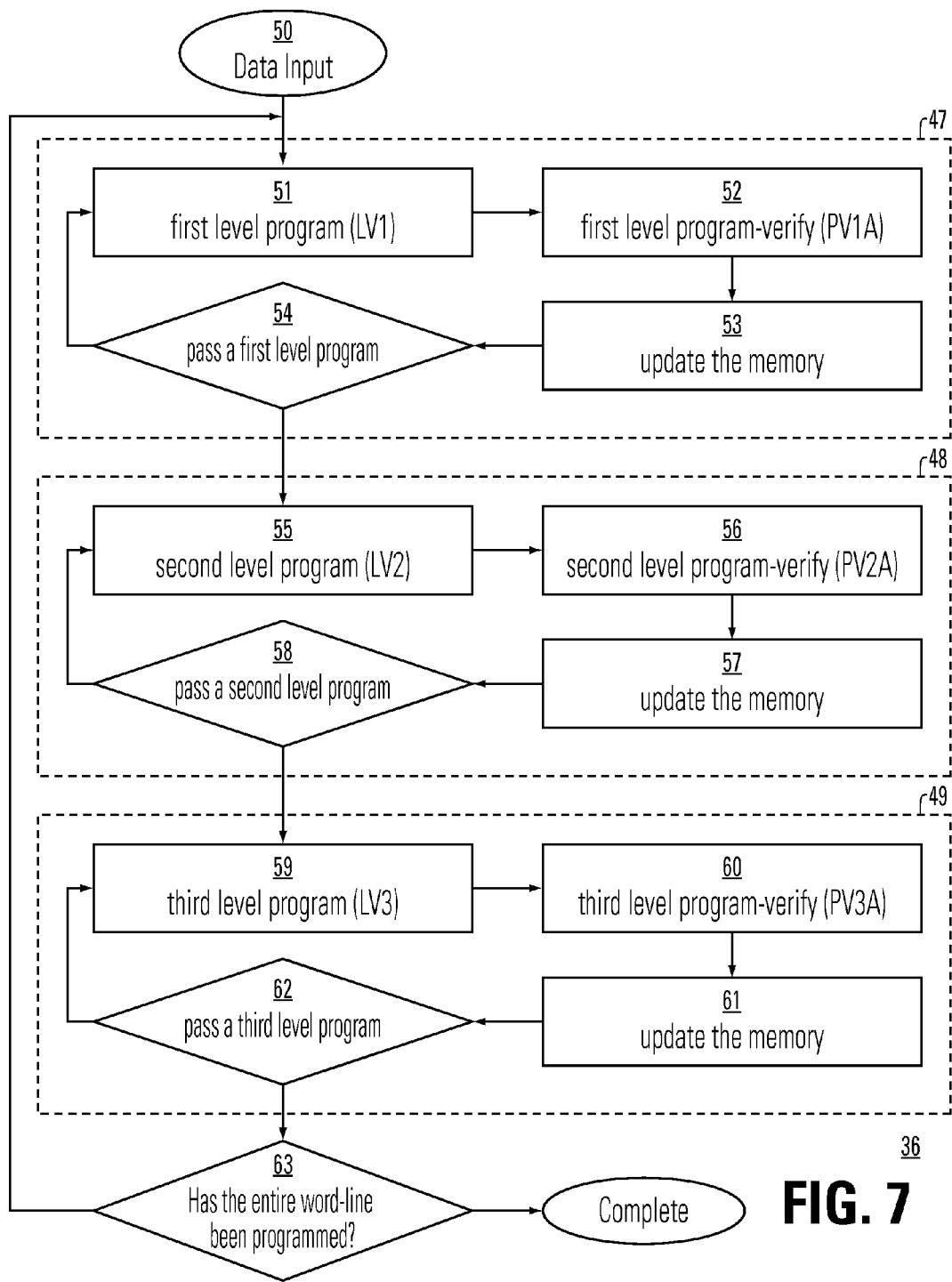
FIG. 7 is a flow diagram of a second embodiment of the pre-program phase for conducting program and program-verify operations of the charge trapping memory cell in accordance with one embodiment.

FIG. 7 illustrates a flow diagram of a second embodiment of the pre-program phase 36 for programming of the charge trapping memory cells. In this embodiment, at step 50, the user enters a value that is less than the entire range of a whole word line, such as one page at a time or referred to as a page unit. There are multiple page units in a word line. As a result, after the third program and program-verify level 59, the memory that comprises a plurality of charge trapping memory cells is checked to determine if an entire word line has been programmed and a program-verify has been conducted at step 63. If there remain additional charge trapping memory cells in the selected word line, then additional program and program-verify cycles are instituted. For example, if one word line stores 16 kilobytes of information and the size of a buffer or an SRAM is just 2 kilobytes, the program sequence would process 2 kilobytes at a time, and go through the process eight times to process all 16 kilobytes of information in 2 kilobyte increments.

The program sequence described progresses from a lower level (a first level) to higher levels (second and third levels). In some embodiments, the program sequence does not need to go from a lower level to higher levels. The program sequence can progress from a higher level (a third level) to lower levels (a second level and a first level). In other embodiments, the first level program and program-verify level may be associated with a first group of charge trapping memory cells in a selected word line. The second level program and program-verify level may be associated with a second group of charge trapping memory cells in a selected word line. The third level program and program-verify level may be associated a third group of charge trapping memory cells in a selected word line.

Figure 8:
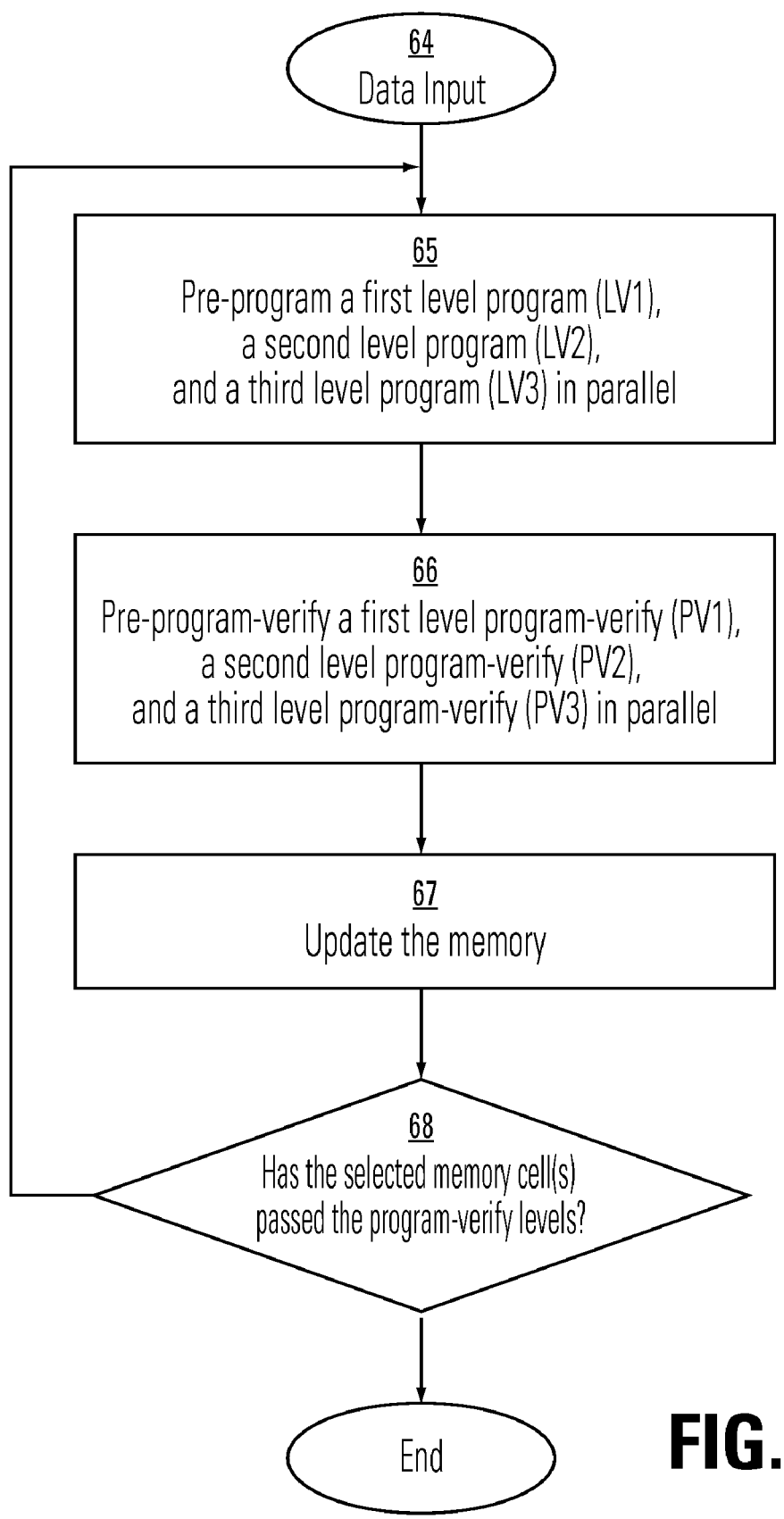
FIG. 8 is a flow diagram of a third embodiment in carrying out pre-program and program-verify operations in parallel of the charge trapping memory cell in accordance with one embodiment.

FIG. 8 illustrates a flow diagram of a third embodiment in carrying out pre-program and program-verify operations in parallel of the charge trapping memory cells in a selected word line or a page unit in the selected word line. At step 64, user data is entered to specify a charge trapping memory cell, or a range of charge trapping memory cells, such as one word line range charge trapping memory cells. The data may require some combination for a first level program, a second level program, or a third level program of the charge trapping memory cell 10. At step 65, a parallel pre-program operation is applied to the charge trapping memory cells for programming a first level program (LV1), a second level program (LV2) and a third level program (LV3). The simultaneous programming of all three pre-program levels may require three bias conditions where each bias condition corresponds with a particular pre-program level. For example, a first bias condition is applied to a first level program, a second bias condition is applied to a second level program, and a third bias condition is applied to a third level program. A program-verify operation is also conducted in parallel at step 66. During the program-verify operation, all three program-verify levels are read at the same time. For example, the binary bit values of "01", "01" or "10" are read and compared with a first program-verify level (PV1), a second program-verify level (PV2), and a third program-verify level (PV3). In some embodiments, the number of sense amplifiers is triple because all three program-verify levels are accessed simultaneously. After the program-verify operation 66, the information generated from the program-verify operation is updated in an SRAM at step 67 to indicate which bit or bits have passed the program-verify operation. At step 68, if the charge memory cell 10 does not pass the program-verify operation, step 65 is repeated to once again conduct parallel program and program-verify operations. In addition, following a pre-program phase, the charge trapping memory cells that are electrically connected to the selected word line are programmed to the first program-verify level, the second program-verify level, and the third program-verify level.

The post-program and post-program-verify operations during the post-program phase 37 are executed similarly to the process of the pre-program phase 36 except that the program-verify level is defined at final program-verify levels. The final program-verify levels are denoted by a first final program-verify level (PV1B), a second final program-verify level (PV2B), and a third final program-verify level (PV3B). The operational steps of the pre-program phase 36 are described above with respect to FIGS. 6, 7 and 8. FIGS. 6, 7 and 8 are applicable to the post-program phase 37 by replacing the first program-verify level PV1A with the first final program-verify level PV1B, the second program-verify level PV2A with the second final program-verify level PV2B, and the third program-verify level PV3A with the third final program-verify level PV3B.

Figure 9:
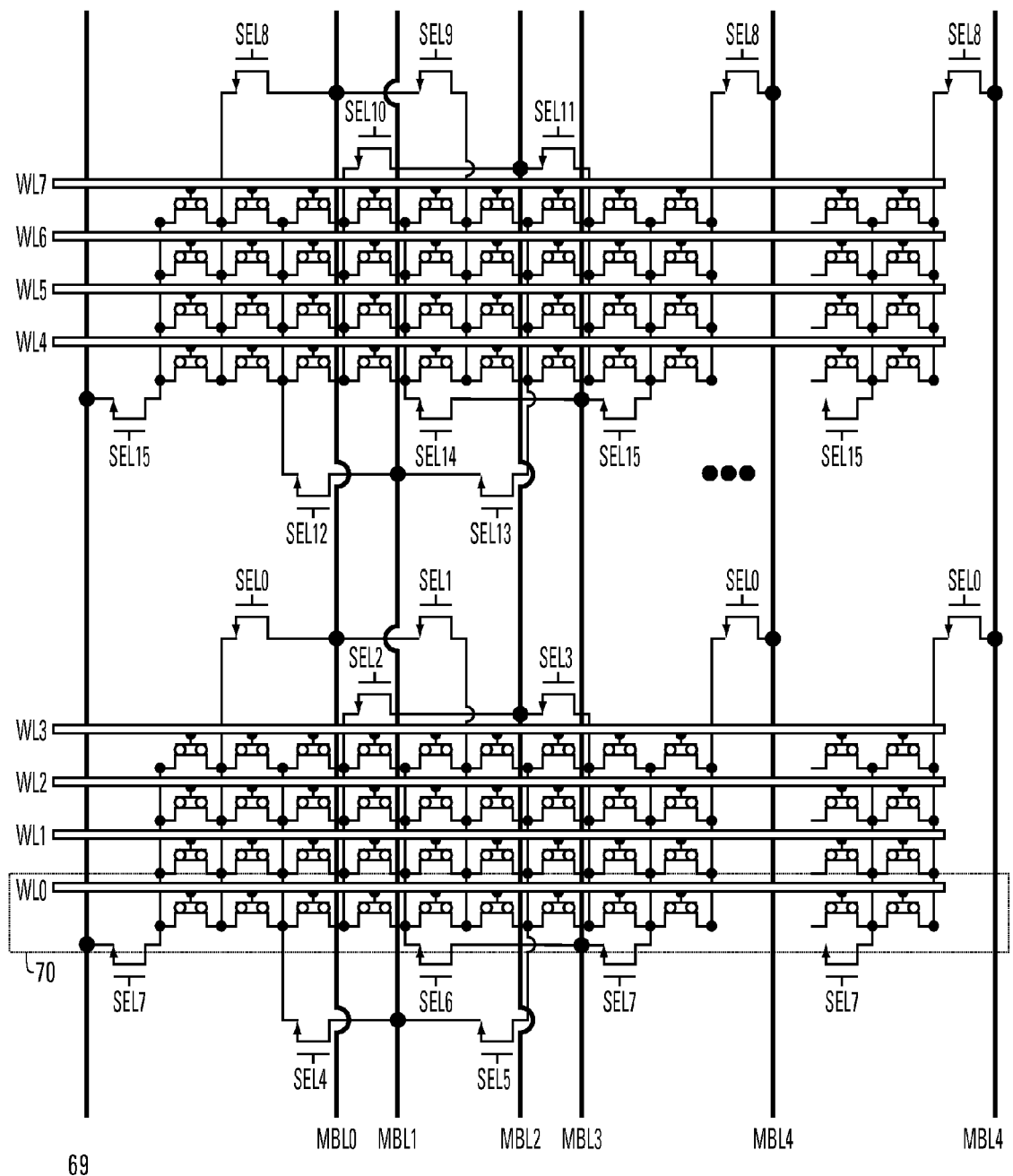
FIG. 9 illustrates a simplified circuit diagram of a memory array that includes a plurality of charge trapping memory cells and word lines in accordance with one embodiment.

FIG. 9 illustrates a simplified circuit diagram of a memory array 69 that includes a plurality of charge trapping memory cells and word lines in accordance with one embodiment. In this embodiment, a word line 70, WL0, has been selected for program and program-verify operations. The word line 70 is electrically connected to a plurality of charge trapping memory cells, such as 16 or 32 kilobytes. One word line range of charge trapping memory cells is therefore, in one example, 32 kilobytes.

Figure 10:
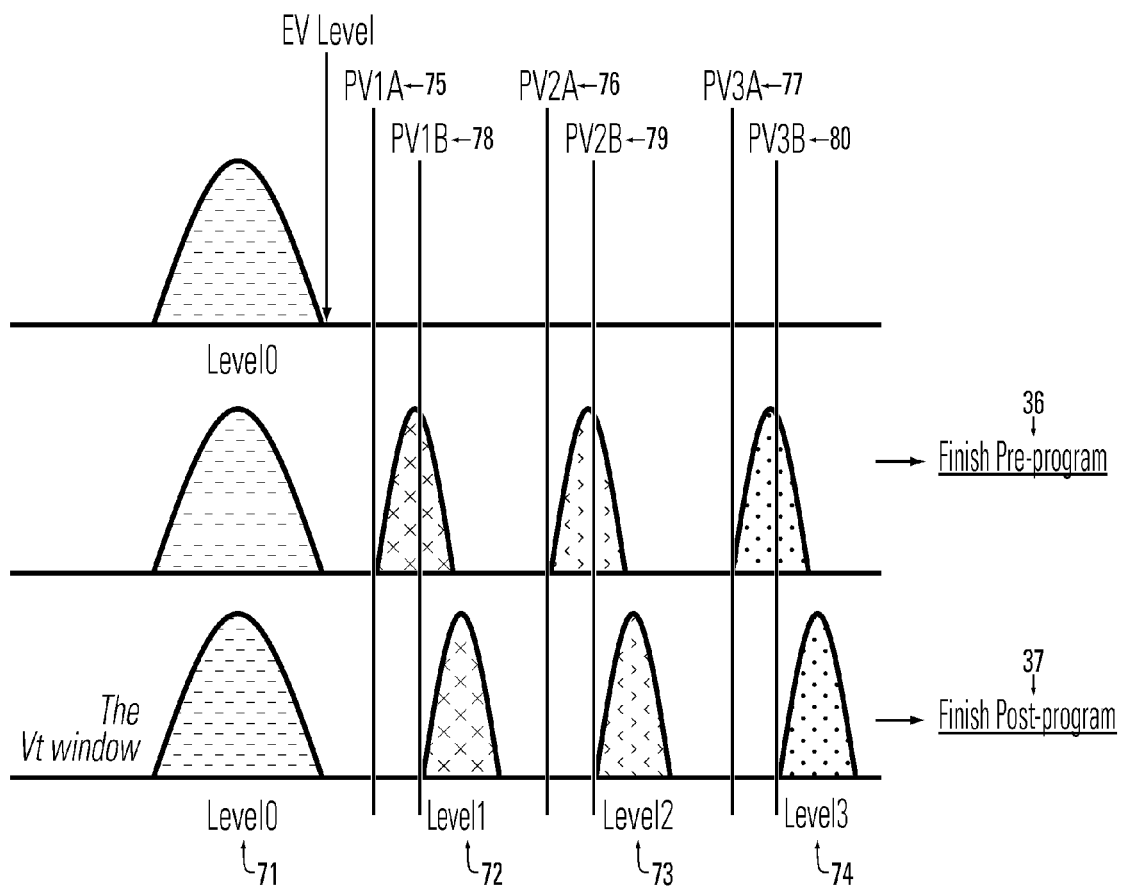
FIG. 10 illustrates a graphical diagram of waveforms representative of the double programming method with pre-program and post-program operations in accordance with one embodiment.

FIG. 10 illustrates a graphical diagram of waveforms representative of a double programming method with pre-program and post-program operations. The charge trapping memory cell 10 has four voltage levels, a zero level (level0) 71 when the charge trapping memory cell 10 is reset or erased, a first voltage threshold level (level1) 72, a second voltage threshold level (level2) 73, and a third voltage threshold level (level3) 74. The charge trapping memory cell 10 has three high voltage threshold Vt levels of varying degrees, the first voltage threshold level 72, the second voltage threshold level 73, and the third voltage threshold level 74. In this embodiment, the second voltage threshold level 73 is a higher value than the first voltage threshold level 72, and the third voltage threshold voltage level 74 is a high value than the second voltage threshold level 73.

During the pre-program phase 36, there are three program-verify levels, a first program-verify level (PV1A) 75, a second program-verify level (PV2A) 76, and a third program-verify level (PV3A) 77. The first program-verify level 75 is associated with the first voltage level 72, the second program-verify level 76 is associated with the second voltage level 73, and the third program-verify level 77 is associated with the third voltage level 74. The three program-verify levels, 75, 76, 77 are set at a voltage level that is less than final voltage levels, also referred to as a first final program-verify level (P V1B) 78, a second final program-verify level (PV2B) 79, and a third final program-verify level (PV3B) 80. One purpose of the pre-program phase 36 is to generate a preliminary pattern along a word line direction which provides an indication of either the complementary bit effect or an array effect due to the differences in environment during a program phase and a read phase, particularly along a word line direction. A program unit during the pre-program phase 36 or the post-program phase 37 is the entire word line or whole word line, in some embodiments. In other embodiments, a program unit during the pre-program phase 36 or the post-program phase 37 is less than a word line or whole word line. The undesirable effect during the post-program phase 37 can be significantly suppressed given that the final environment, i.e., the programming of an adjacent bit status, may be sufficiently formed.

FIGS. 11A-11D illustrate sample graphical diagrams of waveforms representative of pre-program and post-program phases and generating a lower-user-pattern. During the pre-program phase 36, a set of pre-program voltage targets is denoted by the following symbols: the first pre-program-verify level PV1A 75, the second pre-program-verify level PV2A 76 and the third pre-program-verify level PV3A 77. During the post-program phase 37, a set of post-program voltage targets is denoted by the following symbols: the first post-program-verify level PV1B 78, the second post-program-verify level PV2B 79 and the third post-program-verify level PV3B 80. The first post-program-verify level PV1B 78 represents a final first post-program-verify level, as indicated by a line 85, which is a higher value than the first pre-pre-program verify level PV1A 75, as indicated by a line 84. Similarly, the second post-program-verify level PV2B 79 represents a final second post-program-verify level, as indicated by a line 87, which is a higher value than the second post-program verify level PV2B 76, as indicated by a line 86. The third post-program-verify level PV3B 80 represents a final third post-program-verify level, as indicated by a line 89, which is a higher value than the third pre-pre-program verify level PV3B 77, as indicated by a line 88.

A pattern of data is supplied from a source, as a user or a computer, for programming a charge trapping memory. As an illustration, a user may supply the following pattern: "Level1, Level3, Level2, Level2, Level3, . . . ". A representative of the bit status between adjacent charge trapping memory cells in a word line (or a segment of a word line) is formed by programming the charge trapping memory cells along a word line direction to lower program-verify levels, which produces a lower-user-pattern as shown in FIG. 11D. The lower-user-pattern includes a set of corresponding lower program voltage levels: "Level1', Level3', Level2', Level2'. Level3' . . . ". The use of a lower-user-pattern reduces the array effect and the second bit effect to the charge trapping memory. For example, after the pre-program phase 36, the word line pattern is formed from the first pre-program-verify level PV1A 75, the second pre-program-verify level PV2A 76 and the third pre-program-verify level PV3A 77. A lower-user-pattern in this example is selected like the one shown in FIG. 11D. During the post-program phase 37, for instance, the sense current I-sense 29 is sensed for reading the bit A 97. It is noted that the read operation in the charge trapping memory is conducted as a reverse read operation. Given that the bit C 98 and the bit D 99 have already been programmed to a high voltage threshold Vt (that is, Level2'), the leak current I-leak 30 is suppressed. The suppression of the leak current of the charge trapping memory means that the array effect is suppressed. In addition, given that the bit A 97 is programmed from Level1' to the final target voltage of Level 1, rather than having to program from an initial low voltage threshold to the final target voltage of Level 1, the second bit effect is also suppressed due to a reduction to the voltage threshold shift, which results in a reduced variation in the voltage threshold of a neighboring cell.

Figure 12A:
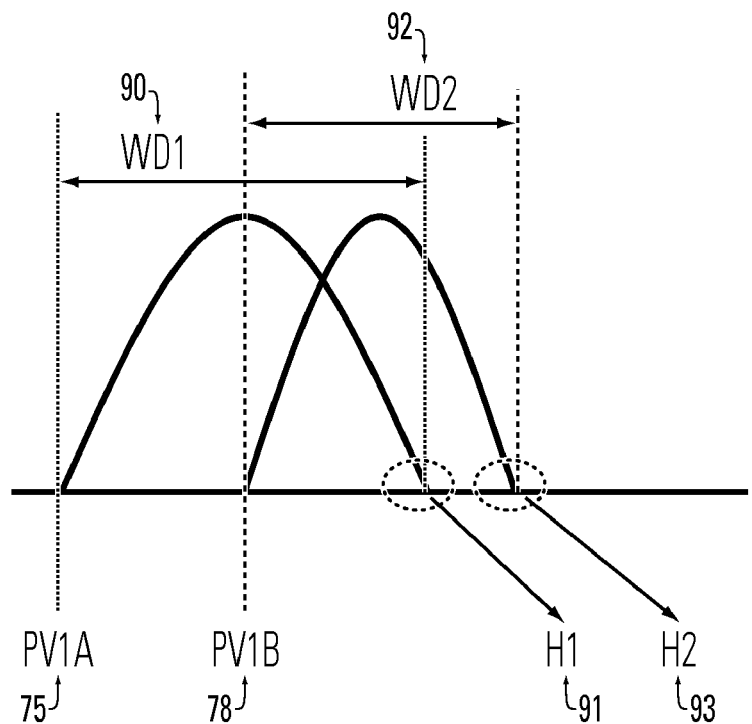
FIGS. 12A-B illustrate sample graphical diagrams of the interrelationship between a pre-program-verify voltage level and a post-program-verify voltage level in accordance with one embodiment.
Figure 12B:
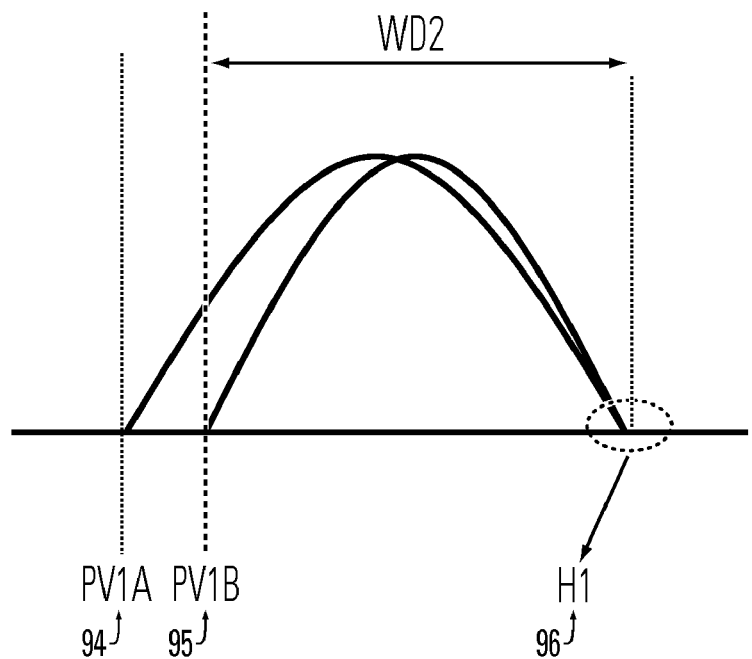

FIGS. 12A-B illustrate sample graphical diagrams of the interrelationship between a pre-program-verify voltage level and a post-program-verify voltage level. The voltage differential between the first pre-program-verify voltage level PV1A 75 and the first post-post-program-verify voltage level PV1B 78 is selected depending on silicon characteristics of an integrated circuit. After the pre-program phase 36, a waveform distribution WD1 90 shows a low side with the first pre-program-verify voltage level PV1A 75, and a high side denoted by a symbol H1 91, as illustrated in FIG. 12A. After the post-program phase 37, a waveform distribution WD2 92 shows a low side with the first post-program-verify voltage level PV1B 78, and a high side denoted by a symbol H2 93, as illustrated in FIG. 12A. In some embodiments, the first pre-program-verify voltage level PV1A 75 is selected to have a sufficiently lower voltage difference from the first post-post-program-verify voltage level PV1B 78 so that the high side H1 91 is not equal to, substantially equal to, or greater than the high side H2 93. As illustrated in FIG. 12B, if a first pre-program-verify voltage level PV1A 94 is near (i.e., not sufficient lower) the voltage value of a first post-post-program-verify voltage level PV1B 95, the result is that the high side H1 91 may be substantially equal to, equal to, or greater than the high side H2 93.

Although the programming of a multi-level-cell in a multi-bit-cell is described above, the present invention is applicable to page programming or other types of programming of a block, a sector, or a sub-block of MLCs in MBCs in a memory array. The present methods are also applicable to non-MBC memory, or a memory which does not have multiple bits per cell. In some embodiments, a bias condition during the pre-program phase 36 may be larger as a way to reduce the programming time. However, the larger bias condition during the pre-program phase 36 typically results in a wider waveform distribution.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method for double programming a multi-level-cell (MLC) in a multi-bit-cell (MBC) of a charge trapping memory, the charge trapping memory having an array of charge trapping memory cells connecting to a plurality of word lines, each word line is connected to a plurality of charge trapping memory cells, each charge trapping memory cell having a first trapping site and a second trapping site, comprising:

receiving a data pattern including a plurality of programming levels;

during a first programming phase, conducting a first program operation and a first program-verify operation to a plurality of charge trapping memory cells along a word line, the first program operation programming the plurality of charge trapping memory cells along the word line to first voltage program levels that are less than corresponding predetermined program voltage levels, the first program-verify operation verifying charge trapping memory cells in the plurality of charge trapping memory cells along the word line to first voltage verifying levels that are less than corresponding predetermined program-verify levels; and during a second programming phase, conducting a second programming operation and a second program-verify operation of the plurality of charge trapping memory cells along the word line, the second programming operation programming the plurality of charge trapping memory cells along the word line to second voltage programming levels that are substantially equal to the predetermined program voltage levels, the second program-verify operation verifying the plurality of charge trapping memory cells along the word line to second voltage verifying levels that substantially equal to the predetermined program-verify levels.

2. The method of claim 1, wherein the first program and first program-verify operations during the first programming phase are conducted in a sequential order, comprising:

programming one or more of the plurality of charge trapping memory cells along the word line to a first pre-program level;

verifying one or more of the plurality of charge trapping memory cells along the word line to a first pre-program-verify level (PV1A);

programming one or more of the plurality of charge trapping memory cells along the word line to a second pre-program level;

verifying one or more of the plurality of charge trapping memory cells along the word line to a second pre-program-verify level (PV2A);

programming one or more of the plurality of charge trapping memory cells along the word line to third pre-program level; and verifying one or more of the plurality of charge trapping memory cells along the word line to a third pre-program-verify level (PV3A).

3. The method of claim 2, wherein the first pre-program-verify level is less than the second pre-program-verify level, and the second pre-program-verify level is less than the third pre-program-verify level.

4. The method of claim 2, wherein the first pre-program-verify level is higher than the second pre-program-verify level, and the second pre-program-verify level is higher than the third pre-program-verify level.

5. The method of claim 1, wherein the first programming and first program-verify operations during the first programming phase are conducted in parallel, comprising:

simultaneously programming the plurality of charge trapping memory cells along the word line to a first pre-program level, a second pre-program level, and a third pre-program level; and simultaneously verifying the plurality of charge trapping memory cells along the word line to a first pre-program-verify level, a second pre-program-verify level and a third pre-program-verify level.

6. The method of claim 1, wherein the second program and second program-verify operations during the second programming phase are conducted in a sequential order, comprising:

programming one or more of the plurality of charge trapping memory cells along the word line to a first program level;

verifying one or more of the plurality of charge trapping memory cells along the word line to a first program-verify level (PV1B);

programming one or more of the plurality of charge trapping memory cells along the word line to a second program level;

verifying one or more of the plurality of charge trapping memory cells along the word line to a second program-verify level (PV2B);

programming one or more of the plurality of charge trapping memory cells along the word line to third program level; and verifying one or more of the plurality of charge trapping memory cells along the word line to a third program-verify level (PV3B).

7. The method of claim 6, wherein the first program-verify level is less than the second program-verify level, and the second program-verify level is less than the third program-verify level.

8. The method of claim 6, wherein the first program-verify level is higher than the second program-verify level, and the second program-verify level is higher than the third program-verify level.

9. The method of claim 1, wherein the first program and first program-verify operations during the first programming phase are conducted in parallel, comprising:

simultaneously programming the plurality of charge trapping memory cells along the word line to a first pre-program level, a second pre-program level, and a third pre-program level; and simultaneously verifying the plurality of charge trapping memory cells along the word line to a first pre-program-verify level, a second pre-program-verify level and a third pre-program-verify level.

10. A method for double programming a multi-level-cell (MLC) in a multi-bit-cell (MBC) of a charge trapping memory, the charge trapping memory having an array of charge trapping memory cells connecting to a plurality of word lines, each word line is connected to a plurality of charge trapping memory cells, each charge trapping memory cell having a first trapping site and a second trapping site, comprising:

receiving a data pattern including a plurality of programming levels;

programming a plurality of charge trapping cells along a word line, comprising:

during a pre-program phase, conducting a pre-program operation to increase threshold voltages and a pre-program-verify operation to verify the increased threshold voltages of a plurality of charge trapping memory cells along the word line, the pre-program verify operation verifying the charge trapping memory cells to a pre-program-verify levels; and during a post-program phase, conducting a post-programming operation to farther increase threshold voltages and a post-program-verify operation to verify the farther increased threshold voltages of the plurality of charge trapping cells along the word line, the post-program verify operation verifying the charge trapping memory cells to corresponding predetermined program-verify levels;

wherein the first program-verify levels are less than the corresponding predetermined program-verify levels.

11. The method of claim 10, wherein the pre-program and pre-program-verify operations during the pre-program phase comprise:

programming the plurality of charge trapping cells along the word line to a first pre-program level;

verifying the plurality of charge trapping cells along the word line to a first pre-program-verify level (PV1A);

programming the plurality of charge trapping cells along the word line to a second pre-program level;

verifying the plurality of charge trapping cells along the word line to a second pre-program-verify level (PV2A);

programming the plurality of charge trapping cells along the word line to third pre-program level; and verifying the plurality of charge trapping cells along the word line to a third pre-program-verify level (PV3A).

12. The method of claim 11, wherein the post-program and post-program-verify operations during the post-program phase comprise:

programming one or more of the plurality of charge trapping cells along the word line to a first program level;

verifying one or more of the plurality of charge trapping cells along the word line to a first program-verify level (PV1B);

programming one or more of the plurality of charge trapping cells along the word line to a second program level;

verifying one or more of the plurality of charge trapping cells along the word line to a second program-verify level (PV2B);

programming one or more of the plurality of charge trapping cells along the word line to third program level; and verifying one or more of the plurality of charge trapping cells along the word line to a third program-verify level (PV3B).

13. The method of claim 11, wherein the first pre-program-verify level is less than the second pre-program-verify level, and the second pre-program-verify level is less than the third pre-program-verify level.

14. The method of claim 11, wherein the first pre-program-verify level is higher than the second pre-program-verify level, and the second pre-program-verify level is high than the third pre-program-verify level.

15. The method of claim 10, wherein the first programming and first program-verify operations during the first programming phase are conducted in parallel, comprising:
   simultaneously programming the plurality of charge trapping cells along the word line to a first pre-program level, a second pre-program level, and a third pre-program level; and
   simultaneously verifying the plurality of charge trapping cells along the word line to a first pre-program-verify level, a second pre-program-verify level and a third pre-program-verify level.

16. The method of claim 10, wherein the second programming and second program-verify operations during the second programming phase are conducted in a sequential order, comprising:
   programming one or more of the plurality of charge trapping memory cells along the word line to a first program level;
   verifying one or more of the plurality of charge trapping memory cells along the word line to a first program-verify level (PV1B);
   programming one or more of the plurality of charge trapping memory cells along the word line to a second program level;
   verifying one or more of the plurality of charge trapping memory cells along the word line to a second program-verify level (PV2B);
   programming one or more of the plurality of charge trapping memory cells along the word line to third program level; and
   verifying one or more of the plurality of charge trapping memory cells along the word line to a third program-verify level (PV3B).

17. The method of claim 16, wherein the first program-verify level is less than the second program-verify level, and the second program-verify level is less than the third program-verify level.

18. The method of claim 16, wherein the first program-verify level is higher than the second program-verify level, and the second program-verify level is high than the third program-verify level.

19. The method of claim 10, wherein the first program and first program-verify operations during the pre-program phase are conducted in parallel, comprising:
   simultaneously programming the plurality of charge trapping cells along the word line to a first pre-program level, a second pre-program level, and a third pre-program level; and
   simultaneously verifying the plurality of charge trapping cells along the word line to a first pre-program-verify level, a second pre-program-verify level and a third pre-program-verify level.

20. A method for double programming a multi-level-cell (MLC) in a multi-bit-cell (MBC) of a charge trapping memory, the charge trapping memory having an array of charge trapping memory cells connecting to a plurality of word lines, each word line including a plurality of segments, each charge trapping memory cell having a first trapping site and a second trapping site, comprising:
   receiving a data pattern including a plurality of programming levels;
   programming a plurality of charge trapping cells in a first segment of a word line, comprising:
      during a pre-program phase, conducting a pre-program operation and a pre-program-verify operation of a plurality of charge trapping memory cells in the first segment of the word line, the pre-program verify operation verifying the charge trapping memory cells to pre-program-verify levels; and
      during a post-program phase, conducting a post-programming operation and a post-program-verify operation of the plurality of charge trapping cells in the first segment of the word line, the post-program verify operation verifying the charge trapping memory cells to corresponding predetermined program-verify levels;
   wherein the pre-program-verify levels are less than the corresponding predetermined program-verify levels.

21. The method of claim 20, wherein the pre-program and pre-program-verify operations during the pre-program phase comprise:
   programming one or more of the plurality the charge trapping memory cells in the first segment of the word line to a first pre-program level;
   verifying one or more of the plurality the charge trapping memory cells in the first segment of the word line to a first pre-program-verify level (PV1A);
   programming one or more of the plurality the charge trapping memory cells in the first segment of the word line to a second pre-program level;
   verifying one or more of the plurality the charge trapping memory cells in the first segment of the word line to a second pre-program-verify level (PV2A);
   programming one or more of the plurality the charge trapping memory cells in the first segment of the word line to a third pre-program level; and
   verifying one or more of the plurality the charge trapping memory cells in the first segment of the word line to a third pre-program-verify level (PV3A).

22. The method of claim 21, wherein the post-program and post-program-verify operations during the post-program phase comprise:
   programming one or more of the plurality the charge trapping memory cells in the first segment of the word line to a first program level;
   verifying one or more of the plurality the charge trapping memory cells in the first segment of the word line to a first program-verify level (PV1B);
   programming one or more of the plurality the charge trapping memory cells in the first segment of the word line to a second program level;
   verifying one or more of the plurality the charge trapping memory cells in the first segment of the word line to a second program-verify level (PV2B);
   programming one or more of the plurality the charge trapping memory cells in the first segment of the word line to third program level; and
   verifying one or more of the plurality the charge trapping memory cells in the first segment of the word line to a third program-verify level (PV3B).

23. The method of claim 21, wherein the first pre-program-verify level is less than the second pre-program-verify level, and the second pre-program-verify level is less than the third pre-program-verify level.

24. The method of claim 21, wherein the first pre-program-verify level is higher than the second pre-program-verify level, and the second pre-program-verify level is higher than the third pre-program-verify level.

25. The method of claim 20, wherein the pre-program and pre-program-verify operations during the pre-program phase are conducted in parallel, comprising:
   simultaneously programming the charge trapping memory cells in the first segment of the word line to a first pre-program level, a second pre-program level, and a third pre-program level; and
   simultaneously verifying the charge trapping memory cells in the first segment of the word line to a first pre-program-verify level, a second pre-program-verify level and a third pre-program-verify level.

26. The method of claim 20, wherein the post-programming operation and a post-program-verify operation during the post-program phase are conducted in a sequential order, comprising:
   programming one or more of the plurality of charge trapping memory cells in the first segment of the word line to a first program level;
   verifying one or more of the plurality of charge trapping memory cells in the first segment of the word line to a first program-verify level (PV1B);
   programming one or more of the plurality of charge trapping memory cells in the first segment of the word line to a second program level;
   verifying one or more of the plurality of charge trapping memory cells in the first segment of the word line to a second program-verify level (PV2B);
   programming one or more of the plurality of charge trapping memory cells in the first segment of the word line to third program level; and
   verifying one or more of the plurality of charge trapping memory cells in the first segment of the word line to a third program-verify level (PV3B).

27. The method of claim 26, wherein the first program-verify level is less than the second program-verify level, and the second program-verify level is less than the third program-verify level.

28. The method of claim 26, wherein the first program-verify level is higher than the second program-verify level, and the second program-verify level is high than the third program-verify level.

29. The method of claim 20, wherein the first program and first program-verify operations during the pre-program phase are conducted in parallel, comprising:
   simultaneously programming the charge trapping memory cells in the first segment of the word line to a first pre-program level, a second pre-program level, and a third pre-program level; and
   simultaneously verifying the charge trapping memory cells in the first segment of the word line to a first pre-program-verify level, a second pre-program-verify level and a third pre-program-verify level.

30. The method of claim 20, further comprising programming a plurality of charge trapping cells in a second segment of the word line.

31. The method of claim 30, wherein the programming of the plurality of charge trapping cells in the second segment of the word line comprises:
   during the pre-program phase, conducting the pre-program operation and the pre-program-verify operation of the plurality of charge trapping memory cells in the second segment of the word line, the pre-program verify operation verifying the charge trapping memory cells to the pre-program-verify levels; and
   during the post-program phase, conducting the post-programming operation and the post-program-verify operation of the plurality of charge trapping cells in the second segment of the word line, the post-program verify operation verifying the charge trapping memory cells to the corresponding predetermined program-verify levels;
   wherein the first program-verify levels are less than the corresponding predetermined program-verify levels.

* * * * *